US006746891B2

(12) United States Patent
Cunningham et al.

(10) Patent No.: US 6,746,891 B2
(45) Date of Patent: Jun. 8, 2004

(54) TRILAYERED BEAM MEMS DEVICE AND RELATED METHODS

(75) Inventors: Shawn Jay Cunningham, Colorado Springs, CO (US); Svetlana Tatic-Lucic, Bethlehem, PA (US)

(73) Assignees: Turnstone Systems, Inc., Santa Clara, CA (US); Wispry, Inc., Cary, NC (US)

( * ) Notice: Subject to any disclaimer, the term of this patent is extended or adjusted under 35 U.S.C. 154(b) by 42 days.

(21) Appl. No.: 10/290,920

(22) Filed: Nov. 8, 2002

(65) Prior Publication Data

US 2003/0119221 A1 Jun. 26, 2003

Related U.S. Application Data

(60) Provisional application No. 60/337,527, filed on Nov. 9, 2001, provisional application No. 60/337,528, filed on Nov. 9, 2001, provisional application No. 60/337,529, filed on Nov. 9, 2001, provisional application No. 60/338,055, filed on Nov. 9, 2001, provisional application No. 60/338,069, filed on Nov. 9, 2001, and provisional application No. 60/338,072, filed on Nov. 9, 2001.

(51) Int. Cl.7 .......................... H01L 21/00; H01L 21/92
(52) U.S. Cl. .............................. 438/52; 438/48; 438/53
(58) Field of Search ................. 438/48, 52, 53; 257/415

(56) References Cited

U.S. PATENT DOCUMENTS

| 5,970,315 | A | * | 10/1999 | Carley et al. ............... 438/52 |
| 6,040,611 | A | * | 3/2000 | De Los Santos et al. ... 257/415 |
| 6,396,368 | B1 | | 5/2002 | Chow et al. ................ 333/262 |
| 6,410,361 | B2 | * | 6/2002 | Dhuler et al. ............... 438/54 |
| 6,495,387 | B2 | * | 12/2002 | French ....................... 438/52 |
| 6,555,201 | B1 | * | 4/2003 | Dhuler et al. .............. 428/137 |
| 6,555,404 | B1 | * | 4/2003 | Kubena et al. .............. 438/22 |
| 6,583,374 | B2 | * | 6/2003 | Knieser et al. ............ 200/181 |
| 6,630,367 | B1 | * | 10/2003 | Kubena et al. .............. 438/48 |
| 2002/0023999 | A1 | | 2/2002 | Hsu et al. ................ 250/201.3 |
| 2002/0055260 | A1 | | 5/2002 | Chow et al. ............... 438/689 |
| 2002/0131228 | A1 | | 9/2002 | Potter ....................... 361/233 |
| 2003/0207487 | A1 | * | 11/2003 | Kubena et al. .............. 438/52 |

* cited by examiner

*Primary Examiner*—Alexander Ghyka
(74) *Attorney, Agent, or Firm*—Pillsbury Winthrop LLP

(57) ABSTRACT

Trilayered Beam MEMS Device and Related Methods. According to one embodiment, a method for fabricating a trilayered beam is provided. The method can include depositing a sacrificial layer on a substrate and depositing a first conductive layer on the sacrificial layer. The method can also include forming a first conductive microstructure by removing a portion of the first conductive layer. Furthermore, the method can include depositing a structural layer on the first conductive microstructure, the sacrificial layer, and the substrate and forming a via through the structural layer to the first conductive microstructure. Still furthermore, the method can include the following: depositing a second conductive layer on the structural layer and in the via; forming a second conductive microstructure by removing a portion of the second conductive layer, wherein the second conductive microstructure electrically communicates with the first conductive microstructure through the via; and removing a sufficient amount of the sacrificial layer so as to separate the first conductive microstructure from the substrate, wherein the structural layer is supported by the substrate at a first end and is freely suspended above the substrate at an opposing second end.

21 Claims, 9 Drawing Sheets

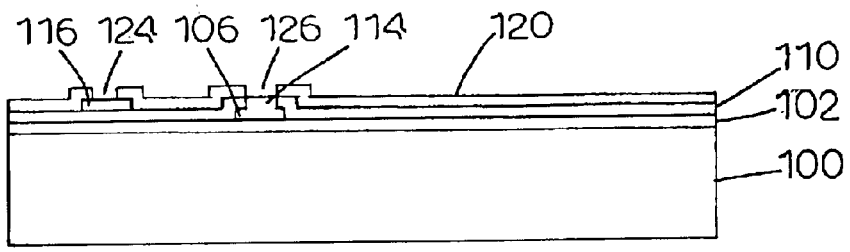
FIG·1I
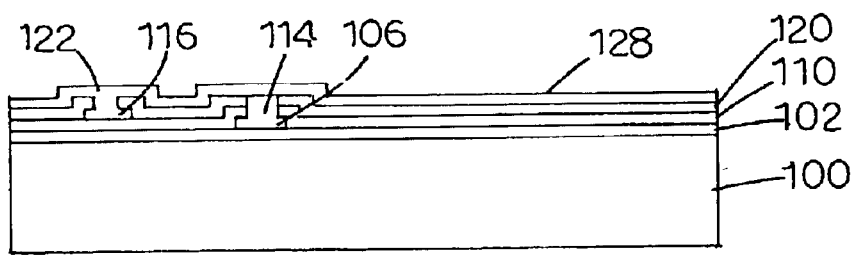
FIG·1J
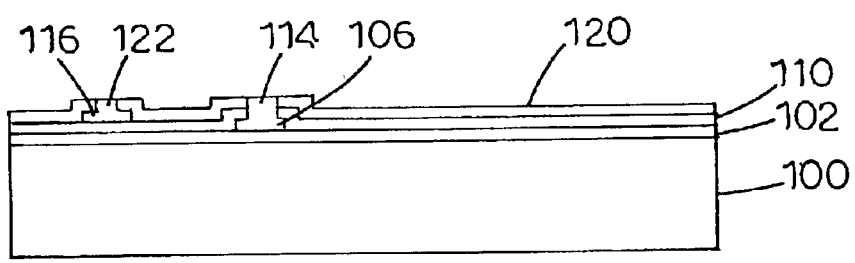
FIG·1K
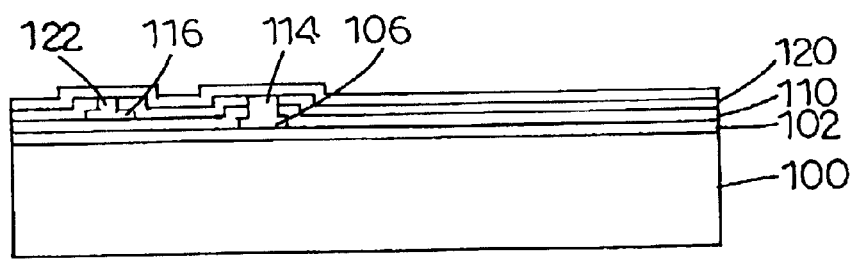
FIG·1L

TRILAYERED BEAM MEMS DEVICE AND RELATED METHODS

CROSS-REFERENCE TO RELATED APPLICATION

This nonprovisional application claims the benefit of U.S. Provisional Application No. 60/337,527, filed Nov. 9, 2001; U.S. Provisional Application No. 60/337,528, filed Nov. 9, 2001; U.S. Provisional Application No. 60/337,529, filed Nov. 9, 2001; U.S. Provisional Application No. 60/338,055, filed Nov. 9, 2001; U.S. Provisional Application No. 60/338,069, filed Nov. 9, 2001; U.S. Provisional Application No. 60/338,072, filed Nov. 9, 2001, the disclosures of which are incorporated by reference herein in their entirety. Additionally, the disclosures of the following U.S. Patent Applications, commonly assigned and simultaneously filed herewith, are all incorporated by reference herein in their entirety: U.S. Patent Applications entitled "MEMS Device Having a Trilayered Beam and Related Methods"; "MEMS Device Having Contact and Standoff Bumps and Related Methods"; "MEMS Switch Having Electrothermal Actuation and Release and Method for Fabricating"; and "Electrothermal Self-Latching MEMS Switch and Method".

TECHNICAL FIELD

The present invention generally relates to micro-electromechanical systems (MEMS) devices and methods. More particularly, the present invention relates to a trilayered beam MEMS device and related methods.

BACKGROUND ART

An electrostatic MEMS switch is a switch operated by an electrostatic charge and manufactured using micro-electromechanical systems (MEMS) techniques. A MEMS switch can control electrical, mechanical, or optical signal flow. MEMS switches have typical application to telecommunications, such as DSL switch matrices and cell phones, Automated Testing Equipment (ATE), and other systems that require low cost switches or low-cost, high-density arrays.

As can be appreciated by persons skilled in the art, many types of MEMS switches and related devices can be fabricated by either bulk or surface micromachining techniques or a combination of both types of techniques. Bulk micromachining generally involves sculpting one or more sides of a substrate to form desired three-dimensional structures and devices in the same substrate material. The substrate is composed of a material that is readily available in bulk form, and thus ordinarily is silicon or glass. Wet and/or dry etching techniques are employed in association with etch masks and etch stops to form the microstructures. Etching is typically performed on the backside or frontside of the substrate. The etching technique can generally be either isotropic or anisotropic in nature. Isotropic etching is insensitive to the crystal orientation of the planes of the material being etched (e.g., the etching of silicon using a mixture of hydrofluoric, nitric, and acetic acids (HNA) as the etchant). Anisotropic etchants, such as potassium hydroxide (KOH), tetramethyl ammonium hydroxide (TMAH), and ethylenediamine pyrochatechol (EDP), selectively attack different crystallographic orientations at different rates, and thus can be used to define relatively accurate sidewalls in the etch pits being created. Etch masks and etch stops are used to prevent predetermined regions of the substrate from being etched.

On the other hand, surface micromachining generally involves forming three-dimensional structures by depositing a number of different thin films on the top of a silicon wafer, but without sculpting the wafer itself. The films usually serve as either structural or sacrificial layers. Structural layers are frequently composed of polysilicon, silicon nitride, silicon dioxide, silicon carbide, or aluminum. Sacrificial layers are frequently composed of polysilicon, photoresist material, polymide, metals, or various kinds of oxides, such as PSG (phosphosilicate glass) and LTO (low-temperature oxide). Successive deposition, etching, and patterning procedures are carried out to arrive at the desired microstructure. In a typical surface micromachining process, a silicon substrate is coated with an isolation layer, and a sacrificial layer is deposited on the coated substrate. Windows are opened in the sacrificial layer, and a structural layer is then deposited and etched. The sacrificial layer is then selectively etched to form a free-standing, movable microstructure such as a beam or a cantilever out of the structural layer. The microstructure is ordinarily anchored to the silicon substrate, and can be designed to be movable in response to an input from an appropriate actuating mechanism.

Many current MEMS switch designs employ cantilevered beam/plate, or multiply-supported beam/plate geometry for the switching structure. In the case of cantilevered beams/plates, these MEMS switches include a movable, bimaterial beam comprising a structural layer of dielectric material and a layer of metal. Typically, the dielectric material is fixed at one end with respect to the substrate and provides structural support for the beam. The layer of metal is attached on the underside of the dielectric material and forms a movable electrode and a movable contact. The layer can be part of the anchor or attachment to the substrate. The movable beam is actuated in a direction toward the substrate by the application of a voltage difference across the electrode and another electrode attached to the surface of the substrate. The application of the voltage difference to the two electrodes creates an electrostatic field which pulls the beam towards the substrate. The beam and substrate each have a contact which can be separated by an air gap when no voltage is applied, wherein the switch is in the "open" position. When the voltage difference is applied, the beam is pulled to the substrate and the contacts make an electrical connection, wherein the switch is in the "closed" position.

One of the problems that faces current MEMS switches having a bimaterial beam is curling or other forms of static displacement or deformation of the beam. The static deformation can be caused by a stress mismatch or a stress gradient within the films. At some equilibrium temperature, the mismatch effects can be balanced to achieve a flat bimaterial structure, but this does not correct the temperature effects. The mismatch can be balanced through specific processes (i.e., deposition rates, pressures, methods, etc.), material selection, and geometrical parameters such as thickness. This bimaterial structure of metal and dielectric introduces a large variation in function over temperature, because the metal will typically have a higher thermal expansion rate than the dielectric. Because of the different states of static stress in the two materials, the switch can be deformed with a high degree of variability. Switch failure can result from deformation of the beam. Switch failure can occur when (1) electrical contact cannot be established between the movable and stationary contacts, (2) electrical contact is established without any actuation, or (3) the operational parameters are driven out of the acceptable specification range due to static deformation or because of the deformation introduced as a function of temperature. A second mode of failure is observed when the movable contact and the stationary contact are prematurely closed, resulting in a "short". Because of the deformation of the beam, the actuation voltage is increased or decreased depending on whether it is curved away from the substrate or towards the substrate, respectively. Because of this variability, the available voltage may not be adequate to achieve the desired contact force and thus contact resistance.

Some current MEMS switch designs having the bimaterial beam attach the metal layer for the movable electrode to the topside of the dielectric material. The metal-layer for the moving contact must still be on the underside of the dielectric material. This design can in some instances serve to provide isolation between the movable electrode and the stationary electrode on the substrate; however, this design requires a higher voltage for actuation because the gap distance between the metal layer and the electrode attached to the surface of the substrate is greater. The effective gap is the sum of the gap between the stationary electrode and the dielectric, and the dielectric thickness. Thus, such a design requires greater power consumption and creates problems with regard to dielectric charging.

A common approach to develop a cross-bar switch array is by a process of forming the cross-bar interconnect structure on a printed wire board (PWB), printed circuit board (PCB), low temperature ceramic composite (LTCC) substrate, or polymer composite substrate and subsequently attaching a switch the board or substrate. The switch can be attached by a combination of methods such as soldering, wire bonding, bump bonding, flip chip, and other attachment and electric interconnection methods. In this process, the fabrication of the cross-bar interconnect structure is integrated with the MEMS switch process so that they are fabricated on the same substrate with the same process. The advantage of the cross-bar interconnect structure is that an array of input signals can be electrically communicated to a single (or multiple) output of an array of outputs. The array dimensions can be square or rectangular, wherein a square array is an NXN array of N inputs and N outputs and a rectangular array is an NXM array of N inputs and M outputs. The input and output lines of a cross-bar interconnect are electrically connected by the MEMS switch when it is activated in a "closed" position. At each switching node in the cross-bar array, the input/output lines have stationary contact terminals. The integrated MEMS switch functions to establish mechanical and electrical connection between the moving contact and stationary contacts of the input and output lines. The input and output lines communicate through the contact established by the MEMS switch. Alternatively, MEMS switches can be used in a cross-bar array in the usual fashion, if it is attached to the switching nodes of the cross-bar array. This configuration is undesirable because a highly capable fabrication process must be replaced by a less capable assembly process. This will increase the total cost, decrease the quality, complicate the process, and increase the size.

Therefore, it is desirable to provide a fabrication process for producing a structural element (e.g., a beam, plate, and membrane) to improve yield, performance over temperature, actuation, and quality of MEMS switches. It is also desirable to provide a fabrication process for producing a structural element resistant to deformation caused by parasitic or "self" actuation. It is also desirable to provide a fabrication process for producing a structural element that is robust to process variations, film stresses, and their gradients. Furthermore, it is desirable to provide a method for forming a cross-bar interconnect and MEMS switch in the same fabrication process. It is desirable to provide a method that is flexible so that the MEMS switch can be formed and integrated with cross-bar interconnects that are fabricated in another fashion.

DISCLOSURE OF THE INVENTION

According to one embodiment, a method for fabricating a trilayered beam is provided. The method can include depositing a sacrificial layer on a substrate and depositing a first conductive layer on the sacrificial layer. The method can also include forming a first conductive microstructure by removing a portion of the first conductive layer. Furthermore, the method can include depositing a structural layer on the first conductive microstructure, the sacrificial layer, and the substrate and forming a via through the structural layer to the first conductive microstructure. Still furthermore, the method can include the following: depositing a second conductive layer on the structural layer and in the via; forming a second conductive microstructure by removing a portion of the second conductive layer, wherein the second conductive microstructure electrically communicates with the first conductive microstructure through the via; and removing a sufficient amount of the sacrificial layer so as to separate the first conductive microstructure from the substrate, wherein the structural layer is supported by the substrate at a first end and is freely suspended above the substrate at an opposing second end.

According to a second embodiment, a method for fabricating an actuator having a trilayered beam is provided. The method can include forming a first electrode on a substrate and depositing a sacrificial layer on the first electrode and the substrate. The method can also include forming a second electrode on the sacrificial layer and depositing a structural layer on the second electrode, the sacrificial layer, and the substrate. Furthermore, the method can include forming a via through the structural layer to the second electrode; depositing a conductive layer on the structural layer and in the via; and forming a conductive microstructure by removing a portion of the conductive layer, wherein the conductive microstructure electrically communicates with the second electrode through the via. Still furthermore, the method can include removing a sufficient amount of the sacrificial layer so as to separate the second electrode from the substrate, wherein the structural layer is supported by the substrate at a first end and is freely suspended above the substrate at an opposing second end.

According to a third embodiment, a method for fabricating a microscale switch having a trilayered beam is provided. The method can include forming a first electrode on a substrate and forming a first contact on the substrate. The method can also include depositing a sacrificial layer on the first electrode, the first contact, and the substrate. Further, the method can include forming a second electrode on the sacrificial layer and forming a second contact on the sacrificial layer. Additionally, the method can include depositing a structural layer on the second electrode, the second contact, and the sacrificial layer. The method can include forming a first conductive, interconnect via through the structural layer to the second electrode and forming a second conductive, interconnect via through the structural layer to the second contact. Further, the method can include forming an electrode interconnect on the structural layer that contacts the first interconnect via and forming a contact interconnect on the structural layer that contacts the second interconnect via.

According to a fourth embodiment, a method for fabricating a microscale switch having a cross-bar interconnect is provided. The method can include the following: forming a conductive interconnect on a substrate; depositing dielectric layer on the conductive interconnect; and forming a first conductive, interconnect via through the dielectric layer to the conductive interconnect. The method can also include forming a first contact on the dielectric layer wherein the first contact connects to the first interconnect via and forming a first electrode on the substrate. Additionally, the method can include the following: depositing a sacrificial layer on the first electrode, the first contact, and the substrate; forming a second electrode on the sacrificial layer; forming a first conductive, interconnect via through the structural layer to the second electrode; forming a second conductive, interconnect via through the structural layer to the second contact; and forming an electrode interconnect on the structural layer that contacts the first interconnect via. The method can also include forming a contact interconnect on the structural layer that contacts the second interconnect via.

According to a fifth embodiment, a method for fabricating a microscale switch having a cross-bar interconnect is provided. The method can include the following: forming a conductive interconnect on a substrate; depositing dielectric layer on the conductive interconnect; forming a first conductive, interconnect via through the dielectric layer to the conductive interconnect; and forming a first contact on the dielectric layer wherein the first contact connects to the first interconnect via. The method can also include forming a first electrode on the substrate and depositing a sacrificial layer on the first electrode, the first contact, and the substrate. The method can include the following: forming a second electrode on the sacrificial layer; forming a second contact on the sacrificial layer; depositing a structural layer on the second electrode, the second contact, and the sacrificial layer; forming a second conductive, interconnect via through the structural layer to the second electrode; and forming a third conductive, interconnect via through the structural layer to the second contact. The method can also include forming an electrode interconnect on the structural layer that contacts the second interconnect via and forming a contact interconnect on the structural layer that contacts the third interconnect via.

According to a sixth embodiment, a method for fabricating a microscale switch having a trilayered beam is provided. The method can include the following: forming a first and second conductive interconnect on a substrate; depositing at least one dielectric layer on the first and second conductive interconnect; and forming a first and second conductive, interconnect via through the at least one dielectric layer to the first and second conductive interconnects, respectively. The method can also include forming a first and second contact on the dielectric layer wherein the first contact connects to the first interconnect via and the second contact connects to the second interconnect via and forming a first electrode on the substrate. Further, the method can include the following: depositing a sacrificial layer on the first electrode, the first contact, and the second contact; forming a second electrode on the sacrificial layer; forming a third and fourth contact on the sacrificial layer, depositing a structural layer on the second electrode, the third contact, the fourth contact, and the sacrificial layer; forming a third conductive, interconnect via through the structural layer to the second electrode; and forming a fourth and fifth conductive, interconnect via through the structural layer to the third and fourth contacts, respectively. The method can also include forming an electrode interconnect on the structural layer that contacts the third interconnect via and forming a contact interconnect on the structural layer that contacts the fourth and fifth interconnect vias.

According to a seventh embodiment a microscale structure is provided. The structure can include a substrate and a structural dielectric arm supported by the substrate and having upper and lower surfaces suspended above the substrate, and having a via registering with the upper and lower surfaces. The structure can also include a first conductive element contacting the lower surface and a second conductive element contacting the upper surface and electrically communicating with the first conductive element through the via.

According to an eighth embodiment, a microscale switch having a conductive interconnect is provided. The switch can include the following: a substrate having a first conductive interconnect and a stationary electrode; a first dielectric layer formed on the first conductive interconnect; and a first stationary contact attached to the first dielectric layer and having electrical communication with the first conductive interconnect. The switch can also include the following: a movable structural layer including a bottom surface suspended over the first stationary contact and a top surface opposing the bottom surface; a movable electrode attached to the bottom surface of the structural layer whereby the movable electrode is separated from the stationary electrode by a first gap; and an electrode interconnect attached to the top surface of the structural layer and connected to the movable electrode for electrical communication. Further, the switch can include a movable contact attached to the bottom surface of the structural layer whereby the movable contact is separated from the first stationary contact by a second gap and positioned to contact the first stationary contact when the structural layer moves towards the first stationary contact.

According to a ninth embodiment, a method of implementing switching function in a switch having conductive interconnects is provided. The method can include providing a switch having conductive interconnects. The switch can include a substrate having a first and second conductive interconnect and a stationary electrode and first and second dielectric layers formed on the first and second conductive interconnects, respectively. The switch can also include the following: first and second stationary contacts attached to the first and second dielectric layers, respectively, and having electrical communication with the first and second conductive interconnects, respectively; a movable structural layer including a bottom surface suspended over the first and second stationary contacts and a top surface opposing the bottom surface; and a movable electrode attached to the bottom surface of the structural layer whereby the movable electrode is separated from the stationary electrode by a gap. The method can also include an electrode interconnect attached to the top surface of the structural layer and connected to the movable electrode for electrical communication and a movable contact attached to the bottom surface of the structural layer and positioned to contact the first and second stationary contacts when the structural layer moves towards the first and second stationary contacts. Further, the method can include applying a voltage between the electrode interconnect and the stationary electrode to electrostatically couple the movable electrode with the stationary electrode across the gap, whereby the resilient structural layer is deflected toward the substrate and the movable contact contacts the first and stationary contacts for establishing electrical communication between the first and second conductive interconnects.

Accordingly, it is an object to provide a method for fabricating a MEMS device having a trilayered beam and related methods.

An object having been stated hereinabove, and which is achieved in whole or in part by the trilayered beam MEMS device and related methods described herein, other objects will become evident as the description proceeds when taken in connection with the accompanying drawings as best described hereinbelow.

BRIEF DESCRIPTION OF THE DRAWINGS

Exemplary embodiments of the invention will now be explained with reference to the accompanying drawings, of which.

DETAILED DESCRIPTION OF THE INVENTION

Figure 1A:
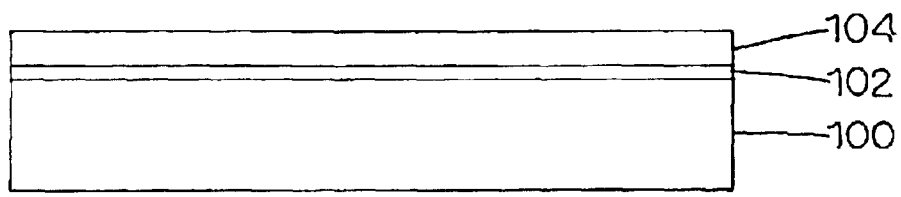
FIGS. 1A–1V illustrate fabrication steps of a method for fabricating a MEMS switch having a trilayered beam.

For purposes of the description herein, it is understood that when a component such as a layer or substrate is referred to as being deposited or formed "on" another component, that component can be directly on the other component or, alternatively, intervening components (for example, one or more buffer or transition layers, interlayers, electrodes or contacts) can also be present. Furthermore, it is understood that the terms "disposed on" and "formed on" are used interchangeably to describe how a given component can be positioned or situated in relation to another component. Therefore, it will be understood that the terms "disposed on" and "formed on" do not introduce any limitations relating to particular methods of material transport, deposition, or fabrication.

Contacts, interconnects, conductive vias, and electrodes of various metals can be formed by sputtering, CVD, or evaporation. If gold, nickel, copper, or PERMALLOY™ ($Ni_xFe_y$) is employed as the metal element, an electroplating process can be carried out to transport the material to a desired surface. The chemical solutions used in the electroplating of various metals are generally known. Some metals, such as gold, might require an appropriate intermediate adhesion layer to prevent peeling. Examples of adhesion material often used include chromium, titanium, or an alloy such as titanium tungsten (TiW). To prevent interstitial or intergranular diffusion, diffusion barriers can be required between different layers. Suitable diffusion barriers include titanium nitride (TiN), molybdenum (Mo), nickel (Ni), tantalum nitride (TaN) or any combination thereof. Alternatively, any other suitable diffusion barrier known to those of skill in the art can be used. For example, nickel can be used as a diffusion barrier to the chromium adhesion layer diffusing along the grain boundaries of a gold metalization.

Conventional lithographic techniques can be employed in accordance with fabrication, such as micromachining, of the invention described herein. Accordingly, basic lithographic process steps such as photoresist application, optical exposure, and the use of developers are not described in detail herein.

Similarly, generally known etching processes can be suitably employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of etchant used will depend on the composition of material to be removed, the composition of any masking or etch-stop layer to be used, and the profile of the etched region to be formed. As examples, poly-etch ($HF:HNO_3:CH_3COOH$) can generally be used for isotropic wet etching.

Hydroxides of alkali metals (e.g., KOH), simple ammonium hydroxide ($NH_4OH$). quaternary (tetramethyl) ammonium hydroxide ($(CH_3)_4NOH$, also known commercially as TMAH), and ethylenediamine mixed with pyrochatechol in water (EDP) can be used for anisotropic wet etching to fabricate V-shaped or tapered grooves, trenches or cavities. Silicon nitride can typically be used as the masking material against etching by KOH, and thus can used in conjunction with the selective etching of silicon. Silicon dioxide is slowly etched by KOH, and thus can be used as a masking layer if the etch time is short. While KOH will etch undoped silicon, heavily doped (p++) silicon can be used as an etch-stop against KOH as well as the other alkaline etchants and EDP. Silicon oxide and silicon nitride can be used as masks against TMAH and EDP. The preferred metal used to form contacts and interconnects in accordance with the invention is gold and its alloys, which are resistant to EDP. The adhesion layer applied in connection with forming a gold component (e.g., chromium) is also resistant to EDP.

Commonly known wet etchants can be used to etch materials such as copper, gold, silicon dioxide, and secondary materials such as the adhesion and barrier materials. For example, gold can be etched with an aqueous solution of $KI_3$ in a temperature range of 20 to 50° C. As another example, chromium (a common adhesive layer) can be wet etched at 25° C. is a solution of ceric ammonium nitrate, nitric acid, and $H_2O$. Furthermore, for example, copper can be etched 25° C. in a dilute solution of nitric acid. A common method of etching silicon dioxide is with various aqueous solutions of HF or solutions of HF that are buffered with ammonium fluoride.

It will be appreciated that electrochemical etching in hydroxide solution can be performed instead of timed wet etching. For example, if a p-type silicon wafer is used as a substrate, an etch-stop can be created by epitaxially growing an n-type silicon end layer to form a p-n junction diode. A voltage can be applied between the n-type layer and an electrode disposed in the solution to reverse-bias the p-n junction. As a result, the bulk p-type silicon is etched through a mask down to the p-n junction, stopping at the n-type layer. Furthermore, photovoltaic and galvanic etch-stop techniques are also suitable.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used according to the methods of the invention as starting substrates for the fabrication of microstructures. For example of a dry etching process, silicon dioxide can be etched in chemistries involving $CF_4+O_2$, $CHF_3$, $C_2F_6$, or $C_3F_8$. As another example, gold can be dry etched with $C_2 Cl_2F_4$ or $C_4Cl_2F_4+O_2$.

An alternate patterning prcess to etching is lift-off. In the lift-off process, the conventional photolithography techniques are used for creating the negative image of the desired pattern. The lift-off process is typically used to pattern metals which are deposited as a continuous film or films when adhesion layers and diffusion barriers are needed. Additionally, it can be used to pattern other materials. The metal is deposited on the regions for patterning and on top of the photoresist mask (negative image). The photoresist and metal on top are removed to leave behind the desired pattern of metal.

As used herein, the term "conductive" is generally taken to encompass both conducting and semi-conducting materials.

Examples will now be described with reference to the accompanying drawings.

Figure 1B:
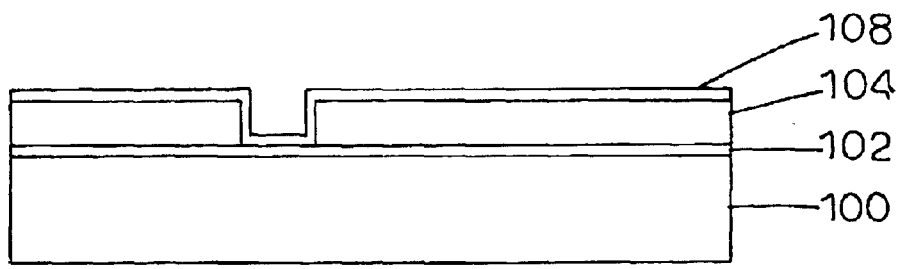
Figure 1C:
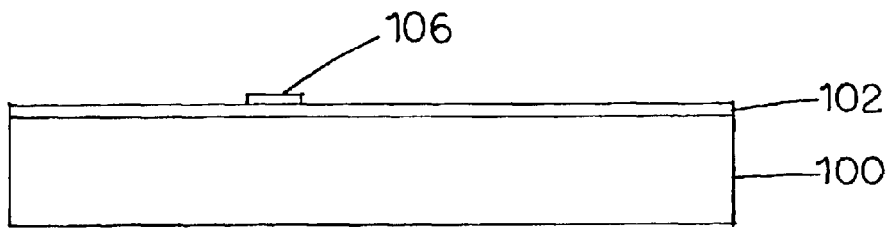
Figure 1D:
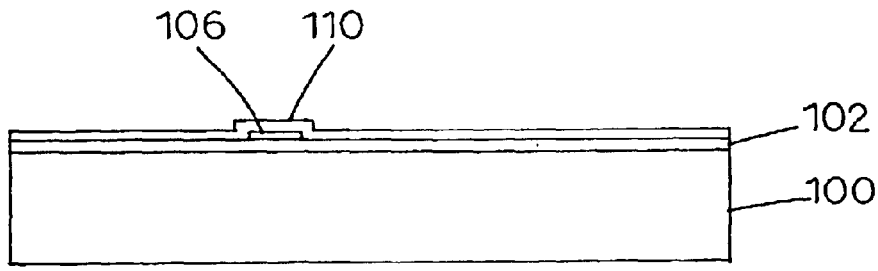
Figure 1E:
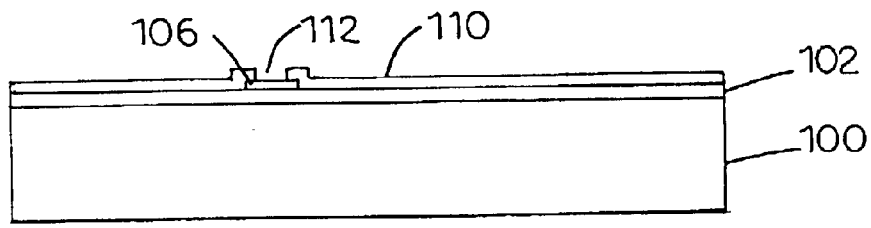
Figure 1F:
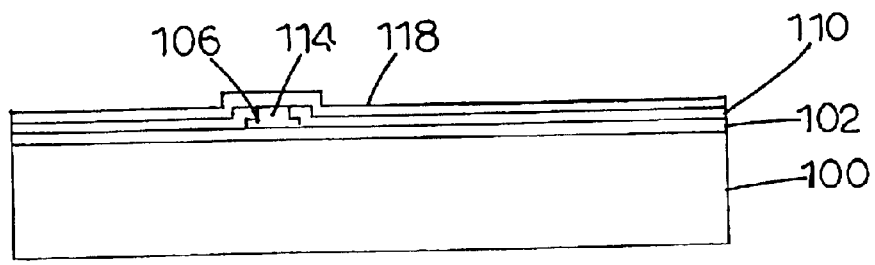
Figure 1G:
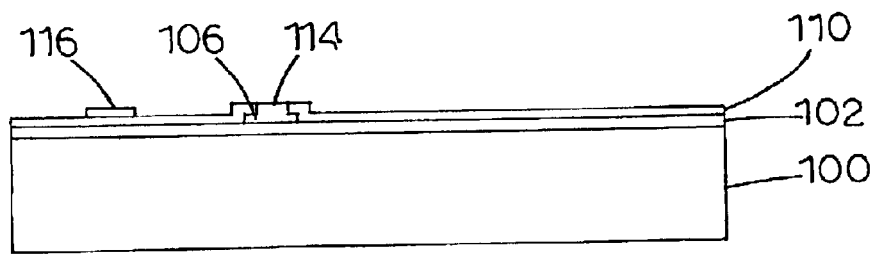
Figure 1H:
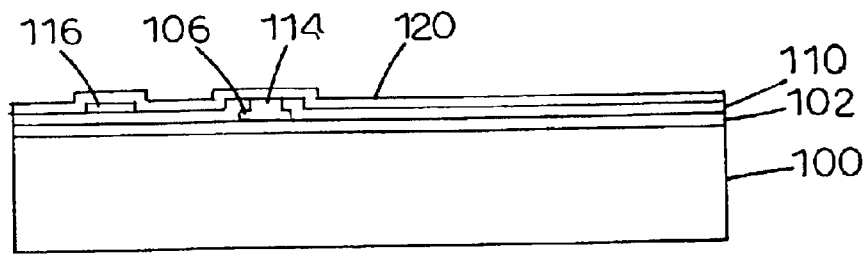
Figure 1M:
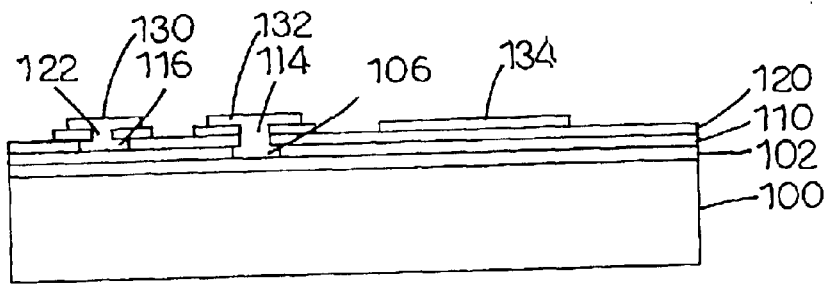
Figure 1N:
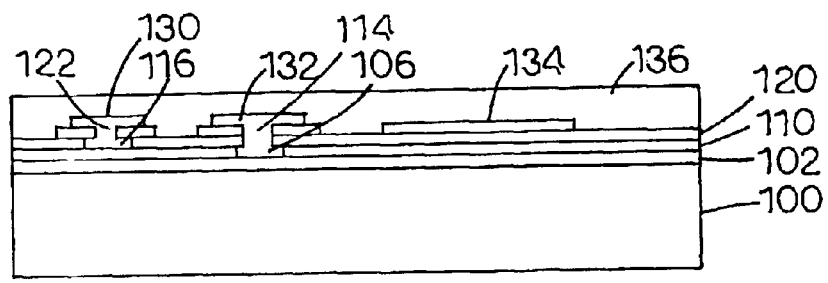
Figure 1O:
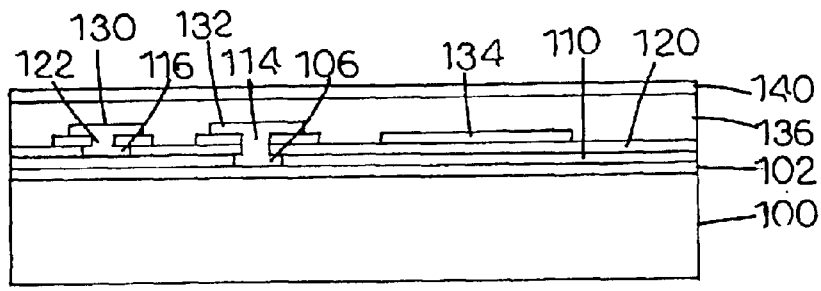
Figure 1P:
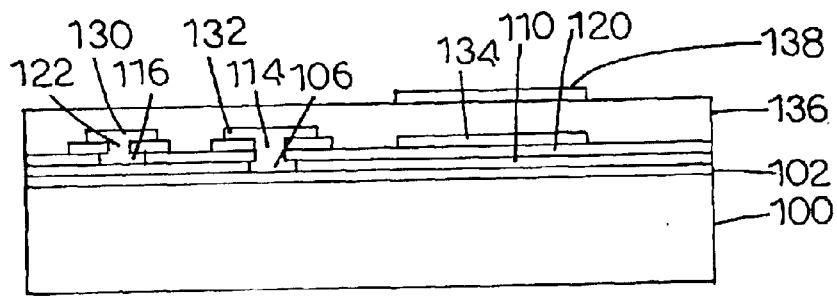
Figure 1Q:
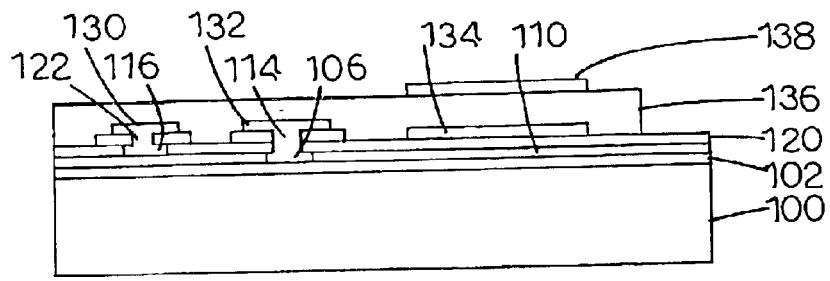
Figure 1R:
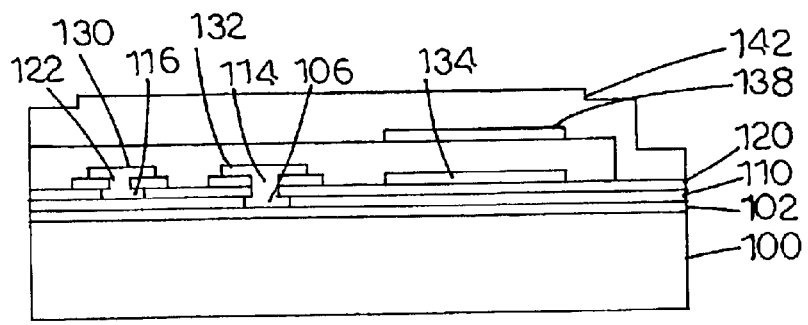
Figure 1S:
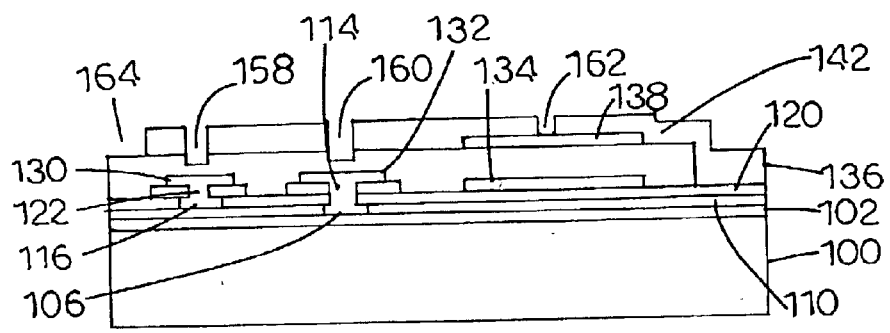
Figure 1T:
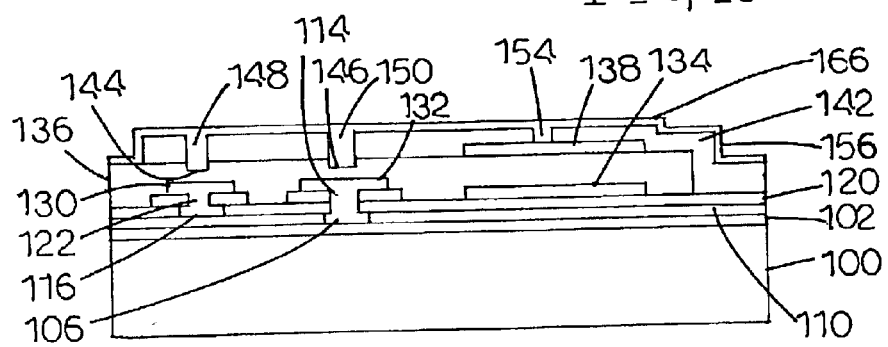
Figure 1U:
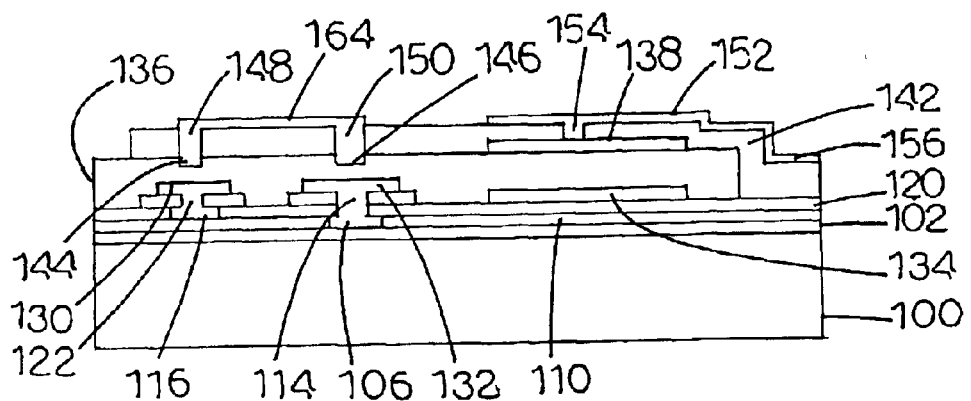
Figure 1V:
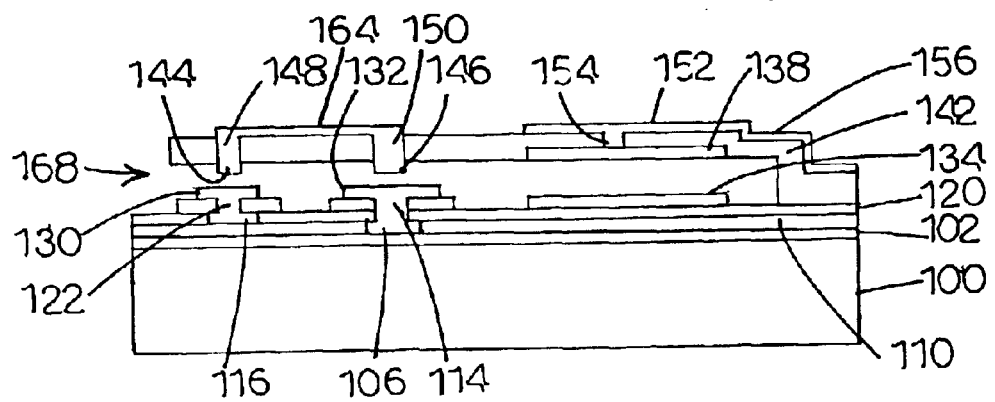

Referring to FIG. 1A–1V a method for fabricating a MEMS switch having a trilayered beam according to a surface micromachining process of the present invention will now be described. The method of fabrication described herein can be used to fabricate other MEMS devices, such as accelerometers, pressure sensors, optical switches, varactors (variable capacitors), variable inductors, and phase shifters. The method of fabrication can be applied to MEMS switches having a trilayered structure, where the trilayered structure can be a doubly-supported beam (attached to the substrate at two ends), a platelmembrane (with edges constrained in different ways, e.g., with four edges constrained), a rigid plate suspended by a multitude of compliant supports such as torsion beams, folded or unfolded beams, and other suspension systems known to those of skill in the art. Referring specifically to FIG. 1A, a starting wafer or substrate 100 is provided, which preferably comprises silicon. Non-limiting examples of materials for use as starting substrate 100 include silicon (in single-crystal, polycrystalline, or amorphous forms), silicon oxinitride, glass, quartz, sapphire, zinc oxide, alumina, silica, or one of the various Group III–V compounds in either binary, ternary orquaternary forms (e.g., GaAs, InP, GaN, AlN, AlGaN, InGaAs, and so on). The conductivity of a silicon layer can be modulated by performing known methods of impurity doping. The various forms of silicon oxides (e.g., $SiO_2$, other silicon oxides, and silicate glass) can be used as structural, insulating, or etch-stop layers. As known in the art, these oxides can be preferentially etched in hydrofluoric acid (HF) to form desired profiles. Various methods for adding oxide material to a substrate are known in the art. For example, silicon dioxide can be thermally grown by oxidizing silicon at high temperatures, in either a dry or wet oxidation process. Oxides and glasses, including phosphosilicate glass (PSG), borosilicate glass (BSG), borophosphosilicate glass (BPSG, also termed low-temperature oxide or LTO), as well as silicon-based thin films, can be deposited by chemical vapor deposition (CVD) including atmospheric pressure CVD (APCVD), low-pressure CVD (LPCVD) and low-temperature plasma-enhanced CVD (PECVD), as well as by physical vapor deposition (PVD) such as sputtering, or in some cases by a spin-n process similar to that used to deposit polymers and photoresists. Both stoichiometric and non-stoichiometric silicon nitride can be used as an insulating film, or as a masking layer in conjunction with an alkaline etch solution, and is ordinarily deposited by a suitable CVD method. If the composition of starting substrate 100 is chosen to be a conductive or semi-conductive material, a non-conductive, first dielectric layer 102 is deposited on the top surface of substrate 100, or at least on portions of the top surface where electrical contacts or conductive regions are desired. Next, a first photolithography mask layer or sacrificial layer 104 is deposited to a uniform thickness for planarizng the top surface of sacrificial layer 104.

Referring to FIGS. 1B–1C, the process for producing a first conductive microstructure 106 via a lift-off patterning process is illustrated. In this embodiment, first conductive microstructure 106 is a cross-bar interconnect suitable for communication with another electrical device. The conductive microstructure 106 extends into the page to a depth greater than the cross-sectional width. Alternatively, first conductive microstructure 106 can extend into the page a distance equal to or less than its cross-sectional width. In another alternative, first conductive microstructure 106 can represent a ground plate that will extend in all directions to completely underlay the MEMS microstructure. Alternatvely, first conductive microstructure 106 can be the fixed plate of a stationary or variable capacitor a part of a planar coil (circular or rectangular) that singularly defines an inductive coil or that is part of a 3-dimensional coil when it is electrically connected to other layers. In yet another embodiment, first conductive microstructure 106 can be any other suitable conductive microstructure for conducting electricity known to those of skill in the art.

Referring specifically to FIG. 1B, first photolithography mask 104 is patterned as shown. A first conductive layer 108 is deposited on first sacrificial layer 104 and the exposed portion of first dielectric layer 102. First conductive layer 108 comprises gold or any suitable conductive material known to those skilled in the art. Non-limiting examples of depositing first conductive layer 108 include sputtering, evaporation, electroplating, and any other suitable method known to those skilled in the art. First conductive layer 108 comprises any suitable adhesion material and diffusion barrier material known to those of skill in the art. The adhesion material promotes adhesion of first conductive layer 108 to first dielectric layer 102 and adhesion of any subsequent dielectric layers. The diffusion barrier inhibits the diffusion of first conductive layer 108 into first dielectric layer 102 and into subsequent conductor or dielectric layers.

Next, a lift-off technique is used for removing the remaining first photolithography mask layer 104 and first conductive layer 108 except for the portion forming first conductive microstructure 106. The lift-off technique comprises immersion in a solvent bath to remove first photolithography mask layer 104 and the unwanted portions of first conductive layer 106. Thus, referring to FIG. 1C, first conductive microstructure 106 remains formed on substrate 100 to perform the function of electrical interconnection, ground/shielding planes, or heat dissipation. Other non-limiting examples of patterning first conductive microstructure 106 includes etching, milling, electroplating, electroless plating, and any other suitable method known to those skilled in the art.

Referring to FIG. 1D, a second dielectric layer 110 is deposited on first dielectric layer 102 and first conductive microstructure 106. Second dielectric layer 110 is conformal to first dielectric layer 102 and first conductive microstructure 106. Alternatively, first dielectric layer 102 can be overdeposited and planarized by any suitable method known to those skilled in the art. A planarization technique such as chemical mechanical planarization (CMP) can be implemented after deposition of second dielectric layer 110 to provide a planar surface for subsequent layers. An alternative planarization method is the utilization of a spin-on dielectric that is self-planarizing. As shown in FIG. 1D, second dielectric layer 110 is not planarized. If the surface is not planarized, the deposited thickness of second dielectric layer 110 will define the thickness of the interlayer dielectric. If the surface is planarized, the dielectric will be deposited to a thickness greater than the thickness of first conductive layer 108 and second dielectric layer 110. The CMP process can remove excess material until the surface is planar and the desired interlayer dielectric thickness is achieved.

Referring to FIGS. 1E–1G, a process for forming a recess 112 to place a first conductive via 114 and a second conductive microstructure 116 is illustrated. In this embodiment, second conductive microstructure 116 is a cross-bar interconnect for providing an electrical connection to another electrical device. Alternatively, second conductive microstructure 116 can be any other suitable conductive microstructure known to those of skill in the art. Referring specifically to FIG. 1E, an etching and patterning process is performed to form recess 112 through second dielectric layer 110 to first conductive microstructure 106. Referring now to FIG. 1F, a second conductive layer 118 is deposited on first conductive microstructure 106 and in recess 112 to second dielectric layer 110. Thus, recess 112 is filled with a conductive material to form first conductive via 114. First conductive via 114 performs the function of electrical interconnection to first conductive microstructure 106, as described in further detail below. In an alternative embodiment, an electrical interconnection can be made to first conductive microstructure 106 by depositing a plug metal-in recess 112. The plug material can be a material different from that of first conductive microstructure 106 or second conductive layer 118. Second conductive layer 118 comprises any suitable adhesion material and diffusion barrier material. The adhesion material promotes adhesion of second conductive layer 108 to second dielectric layer 110 and adhesion of any subsequent dielectric layers. The diffusion barrier inhibits the diffusion of second conductor layer 118 into first conductor layer 108, second dielectric layer 110, and into subsequent conductor or dielectric layers.

Referring now to FIG. 1G, second conductive microstructure 116 is shown formed from the patterning and etching of second conductive layer 118. Second conductive microstructure 116 performs electrical interconnection as described in further detail below. Second conductive microstructure 116 can extend into the page to a depth greater than the cross-sectional width of second conductive microstructure 116. In this embodiment of the cross-bar interconnect, second conductive microstructure 116 will extend perpendicular (to the left and right) to first conductive microstructure 106. Alternatively, second conductive microstructure 116 can extend into the depth of the page by a distance on the order of the cross-sectional width. In this embodiment, the purpose of second conductive microstructure 116 is only for electrical connection between first conductive layer 108 and second conductive layer 118. In another application, second conductive microstructure 116 can represent a ground plate that will extend in all directions to completely underlay the MEMS switch. Alternatively, second conductive microstructure 116 can be the fixed plate of a stationary or variable capacitor or part of a planar coil that singularly defines an inductive coil or that is part of a 3-dimensional coil when it is electrically connected to other layers. Furthermore, second conductive microstructure 116 can be any suitable conductive microstructure known to those of skill in the art. The portion of first conductive via 114 extending beyond the surface of second dielectric layer 110 is etched away.

In the process for forming first conductive via 114 and second conductive microstructure 116 described above, second conductive microstructure 116 and first conductive via 114 are formed simultaneously. Alternatively, the material for first conductive via 114 can be deposited independently of second conductive microstructure 116. The purpose of depositing and patterning first conductive via 114 is to fill first conductive via 114 to the surface of second dielectric layer 110. Next, second conductive microstructure 116 is deposited and patterned as described above. An alternative process for depositing and patterning first conductive via 114 is by a Damascene process. In a Damascene process, second dielectric layer 110 is planarized as described above. An etching and patterning process is performed to form a recess 112 through second dielectric layer 110 to first conductive microstructure 106 brother patterned microstructure in first conductive layer 108. The surface of second dielectric layer 110 is planar except for recess 112. Second conductive layer 118 is deposited on second dielectric layer 110. Second conductive layer 118 is deposited on first conductive microstructure 106 and in recess 112 to second dielectric layer 110. Recess 112 is filled with a conductive material to form first conductive via 114. Second conductive layer 118 can be planarized by any suitable method known to those of skill in the art. A planarization technique such as chemical mechanical planarization (CMP) can be implemented after deposition of second conductive layer 118 to remove all conductive material of second conductive layer 118 except the conductive material that remains to form first conductive via 114. Second conductive microstructure 116 is patterned and formed as described above.

Referring to FIG. 1H, a third dielectric layer 120 is deposited on second dielectric layer 110, second conductive microctructure 116, and first conductive via 114 to produce a conformal surface. Alternatively, the surface of third dielectric layer 120 can be planarized as described above.

Referring to FIGS. 1I–1K, a process for extending first conductive via 114 and forming a second conductive via 122 is illustrated. Referring specifically to FIG. 1I, an etching and patterning process is performed to form recesses 124 and 126. Recess 124 extends from the top surface of third dielectric layer 120 to second conductive microstructure 116. Recess 126 extends from the top surface of third dielectric layer 120 to first conductive via 114. Referring to FIG. 1J a third conductive layer 128 is deposited on second conductive microstructure 116, first conductive via 114, and third dielectric layer 120. Third conductive layer 128 fills recesses 124 and 126. Referring now to FIG. 1K, third conductive layer 128 (shown in FIG. 1J) is patterned and etched to form the extension to first conductive via 114 and second conductive via 122 by the methods described above. Second conductive via 122 performs the function of electrical interconnection to second conductive microstructure 116. Alternatively, second conductive via 122 and the connection to first conductive via 114 can be formed by the Damascene technique described above or by other suitable methods known to those of skill in the art.

Referring to FIGS. 1L–1M, a process for producing a first stationary contact 130, a second stationary contact 132, and a stationary electrode 134 is illustrated. Referring to FIG. 1L, a conductive layer is deposited on first conductive via 114, second conductive via 122, and third dielectric layer 120. The conductive layer is patterned as described above. Referring to FIG. 1M, first stationary contact 130, second stationary contact 132, and stationary electrode 134 are formed simultaneously. Alternatively, first stationary contact 130 and second stationary contact 132 can be formed preceding or following the formation of stationary electrode 134. This sequence of formation will allow first stationary contact 130 and second stationary contact 132 to be formed from different conductive materials, patterned by different patterning methods, or deposited by different deposition methods than stationary electrode 134. For example, first stationary contact 130 can be formed by evaporation deposition and etching. Alternatively, a via plug, a stud, a post, electrical interconnection, transmission lines, waveguides, stationary actuation electrodes, stationary contact electrodes, electrode interconnects, or any other suitable structure known to those of skill in the art can be formed. First stationary contact 130, a second stationary contact 132, and a stationary electrode 134 are formed simultaneously in this process. Alternatively, components 130, 132, and 134 can be formed in separate processes.

First stationary contact 130, second stationary contact 132, and stationary electrode 134 comprise a conductive material such as gold or another suitable metal known to those of skill in the art. Alternatively, first stationary contact 130, second stationary contact 132, and stationary electrode 134 can comprise a semiconductor such as polysilicon, a conductive polymer, or any other suitable conductive material known to those of skill in the art. If first stationary contact 130 and second stationary contact 132 are made of a different material than stationary electrode 134, statonary electrode 134 are preferably made of a much lower conductivity. First stationary contact 130 and second stationary contact 132 should be of very high conductivity material such as copper, aluminum, gold, or their alloys or composites.

Referring to FIG. 1N, a first sacrificial layer 136 is deposited to a uniform thickness such that its top surface is preferably planarized. First sacrificial layer 136 defines the gap between components 130, 132, and 134 and a trilayered beam structure to be formed thereon, as described in detail below. First sacrificial layer 136 comprises a polymer. Alternatively, first sacrificial layer 136 can be a metal, semiconductor, dielectric or any other suitable material known to those of skill in the art such that the removal chemistry is compatible with the other electrical and structural materials. Primarily, first sacrificial layer 136 defines the gap between components on substrate 100 and the trilayered beam structure. Alternatively, a conductive material can form electrical interconnects, transmission lines, waveguides, stationary capacitor plates, or statonary inductor elements. Alternatively, a dielectric or polymer sacrificial layer can be used to define an interlayer dielectric to increase capacity between stationary capacitor plates, to increase isolation between stationary electrodes, as a mechanical support or spring element for the trilayered beam structure. In these embodiments, first sacrificial layer 136 is preferably protected by layers of the trilayered beam structure during the release etch described in more detail below.

Referring to FIGS. 1O–1P, a process for producing a movable electrode 138 is illustrated. Referring to FIG. 1O, a fourth conductive layer 140 is deposited on first sacrificial layer 136. Fourth conductive layer 140 is patterned as described above. Referring to FIG. 1P, movable electrode 138 is formed. Movable electrode 138 comprises a conductive material such as gold or any other suitable metal. Alternatively, movable electrode 138 can comprise a semiconductor such as polysilicon, a conductive polymer, or any other suitable conductive material known to those skilled in the art. Alternatively, fourth conductive layer 140 can be patterned to form a movable contact electrode, a movable contact bar, a movable plate of a variable capacitor, a movable inductor of a variable inductor, a section of an air bridge transmission line/waveguide electrical interconnects, electrode interconnect layers, a structural element of the trilayered beam structure, and as part of the attachment between the structural layer described below, and substrate 100.

Referring to FIGS. 1Q–1R a process for producing a structural layer 142 for providing structure for the beam and attaching the beam to substrate 100 is illustrated. Referring specifically to FIG. 1Q, first sacrificial layer 136 is patterned and etched (dry or wet) through to third dielectric layer 120 as shown for forming a structure to attach the beam to substrate 100 and suspend the beam above components 130, 132, and 134. Alternatively, first sacrificial layer 136 can be patterned by other suitable methods known to those of skill in the art such as lift-off, electroplating, electroless plating, or photoexposure and ashing. Primarily, the patterning of first sacrificial layer 136 defines the location of the attachment portion of the trilayered beam structure to substrate 100. Alternatively, first structural layer 142 is patterned to form insulating interfaces for electrical interconnects, transmission lines, waveguides, stationary capacitor plates, stationary inductor elements, or interlayer dielectrics. Referring to FIG. 1R, structural layer 142 is deposited on third dielectric layer 120, first sacrificial layer 136, and movable electrode 138. Structural layer 142 preferably comprises silicon dioxide which can be deposited by sputtering, evaporation, spin-on, oxidations, or other suitable methods known to those of skill in the art. Alternatively, structural layer 142 can comprise silicon nitride, silicon oxynitride, aluminum oxide, polymers, or any other-suitable non-conductive, resilient material known to those of skill in the art. Structural layer 142 is resilient and provides desired isolation between stationary contacts 130 and 132 and the contacts on the beam as described below. Furthermore, structural layer 142 provides isolation between stationary electrode 134 and the movable electrodes on the beam as described below.

Referring to FIGS. 1S–1U, a process is illustrated for simultaneously producing the following conductive microstructures: a first movable contact 144, a second movable contact 146, a first interconnect 148, a second interconnect 150, an electrode interconnect 152, a third interconnect 154, and an electrical connection 156. Preferably, the dimensions of movable electrode 138 are 180×350 microns. Alternatively, movable electrode 138 can be any other suitable dimensions. These dimensions are determined by desired functionality and manufacturability requirements. Preferably, the dimensions of electrode interconnect 152 are 180×350 microns. Referring specifically to FIG. 1S, recesses 158, 160, and 162 are etched through structural layer 142. Additionally, a recess 164 is etched into structural layer 142. Recess 158 is patterned and etched through structural layer 142 and into first sacrificial layer 136 for forming first interconnect 148 and first movable contact 144. First movable contact 144 and second movable contact 146 comprise a conductive material such as copper, gold, aluminum, their alloys or composites, or any other suitable metal known to those of skill in the art.

Recess 158 is etched into first sacrificial layer 136 so that first movable contact 144 extends beyond structural layer 142. Recess 160 is patterned and etched through structural layer 142 and into first sacrificial layer 136 for forming second interconnect 150 and second movable contact 146. Recess 160 is etched into first sacrificial layer 136 so that second movable contact 146 extends beyond structural layer 142. Recess 162 is patterned and etched through structural layer 142 for forming third interconnect 154 to movable electrode 138. Recess 164 is patterned and etched through structural layer 142 to form a suspended end of the beam and the unconstrained side of the beam. Recesses 158, 160, 162, and 164 can be etched by a dry or wet etch process or patterned by other suitable methods known to those of skill in the art. The simultaneous fabrication of recesses 158, 160, 162, and 164 provide simplification of the overall process relative to the number of photolithography steps and mask layers. Alternatively, it may prove beneficial to form recesses 160, 162, and 164 through structural layer 142 and into first sacrificial layer 136 to form first interconnect 148 and first movable-contact 144. The formation of recesses 160, 162, and 164 through structural layer 142 requires a different process than the formation into first sacrificial layer 136. Additionally, recess 164 can be formed in another step because it is only required to be formed through structural layer 142 and not first sacrificial layer 136. Additionally, recess 164 can be formed by patterning and etching structural layer 142 at the free end of the beam and along the sides, but not at the portion of structural layer that attaches to substrate 100. The sequence of the alternative steps must be determined by simplicity and compatibility. Alternatively, first movable contact 144 and second movable contact 146 can be formed by another pattern in fourth conductive layer 140. Alternatively, first movable contact 144 and second movable contact 146 can be patterned and formed in first sacrificial layer 136. Additionally, a pattern in fourth conductive layer 140 can coincide with the pattern for first movable contact 144 and second movable contact 146 as formed in first sacrificial layer 136. First movable contact 144 and second movable contact 146 can be patterned and formed by methods known to those with skill in the art.

Movable contacts 144 and 146 are required to establish electrical communication between first stationary contact 130 and second stationary contact 132. The electrical communication is established when first movable contact 144 is in close proximity to first stationary contact 130 and when second movable contact is in close proximity to first stationary contact 130. The electrical communication is completed through a path that includes first stationary contact 130, first movable contact 144, first interconnect 148 (the electrical connection described in further detail below), second interconnect 150 (the electrical connection described in further detail below), and second movable contact 146. First movable contact 144 and second movable contact 146 are shown in the plane of the cross-section with first movable contact 144 nearest the free end of the beam and second movable contact 146. In this embodiment, first movable contact 144 establishes contact with first stationary contact 130 and then second movable contact 146 establishes contact with second stationary contact 132. Alternatively, the primary configuration has first movable contact 144 and second movable contact 146 located at the same position along the length of the beam. In this configuration, first movable contact, 144 and second movable contact 146 are separated relative to each other as shown in FIG. 1U. Movable contacts 144 and 146 establish contact with stationary contacts 130 and 132, respectively.

In another embodiment, there is a single movable contact and stationary contact. In this embodiment, the second movable contact functions as a static contact at the fixed end of the beam. The static contact establishes electrical connection through a via in structural layer 142 to second movable contact 146 at the fixed end of the beam. In this embodiment, the electrical connection between second movable contact 146 and the static contact will transverse the length of the beam from the location of second movable contact 146 at the free end of the beam to the static contact at the fixed end of the beam.

Referring to FIG. 1T, a fifth conductive layer 166 is deposited on first sacrificial layer 136 and structural layer 142. Fifth conductive layer 166 is patterned by a method as described above.

Referring to FIG. 1U, electrode interconnect 152 and electrical connection 156 are formed. Electrode interconnect 152 is a structural match to movable electrode 138. In one alternative, the geometry and dimensions of electrode interconnect 152 and movable electrode 138 are matched exactly. The exact matching of these structures provide more robustness to film stress and temperature induced deformation of the beam. In another alternative for achieving similar robustness to film stress and temperature induced beam deformation, electrode interconnect 152 and movable electrode 138 are designed to be structurally similar but geometrically and dimensionally different. The structural response of electrode interconnect 152 is designed to be similar to movable electrode 138 to minimize the effects and variations due to the film stresses and temperature independent of the geometry or dimensions matching. As shown, electrical connection 164 connects first movable contact 144 and second movable contact 146 via first interconnect 148 and second interconnect 150. Electrode interconnect 152 provides an electrical connection to a voltage source (not shown) via electrical connection 164. Movable electrode 138 is provided an electrical connection to the voltage source via another electrical connection (not shown).

Referring to FIG. 1V, the final step in fabricating the MEMS switch is illustrated. In this step, first sacrificial layer 136 is removed to form a trilayered beam, generally designated 168. First sacrificial layer 136 can be removed by any suitable method known to those of skill in the art.

The MEMS switch is illustrated in an "open" position wherein a gap exists between first movable contact 144 and first stationary contact 30 and between second movable contact 146 and second stationary contact 132. In the "open" position, no electrical connection is established between first movable contact 144 and first stationary contact 130 and between second movable contact 146 and second statonary contact 132. Movement of the MEMS switch to a "closed" position can be effected by application of a voltage across stationary electrode 134 and electrical connection 156 via a voltage source. Voltage source can be electrically connected to stationary electrode 134 and electrical connection 156 by a suitable method known to those of skill in the art. Movable electrode 138 is energized by the voltage application due to the electrical connection of movable electrode 138 through electrode interconnect 152, third interconnect 154, and electrical connection 156. When the voltage is applied, an equal and opposite charge is generated on stationary electrode 134 and movable electrode 138. The charge distribution on the opposing electrodes produces an electrostatic force that is balanced by the elastic forces of the now deformed beam. As the voltage is increased, the charge increases in a non-uniform and non-linear fashion across the surface of the beam until an instability point is reached. The stability point is defined by the inability of the elastic forces to maintain equilibrium with the electrostatic forces and the beam snaps through to establish contact. At this point, the voltage can continue to be increased, thereby increasing the contact force and reducing the contact resistance up to the limit of the isolation limits of the beam. The isolation limits are defined by a dielectric breakdown, a gas discharge or breakdown, or an elastic breakdown where the beam snaps through a second time to short the electrodes. Methods known to those skilled in the art can be applied to maximize this isolation. Alternatively, the voltage can be decreased until the release voltage is reached where the beam snaps away from the substrate to "open" the contacts. The release voltage is less, typically, than the pull in voltage that determined closure of the contacts. A monotonic excursion of the voltage-time function is not required to facilitate this operation, such that the switch operates rather instantaneously. The electrical connection 156 and stationary electrode 134 are designed for structural similarity so that the beam is largely flat in the "open" position. Additionally, this structural similarity enhances the performance over temperature because of the thermomechanical balance across the beam.

Figure 2:
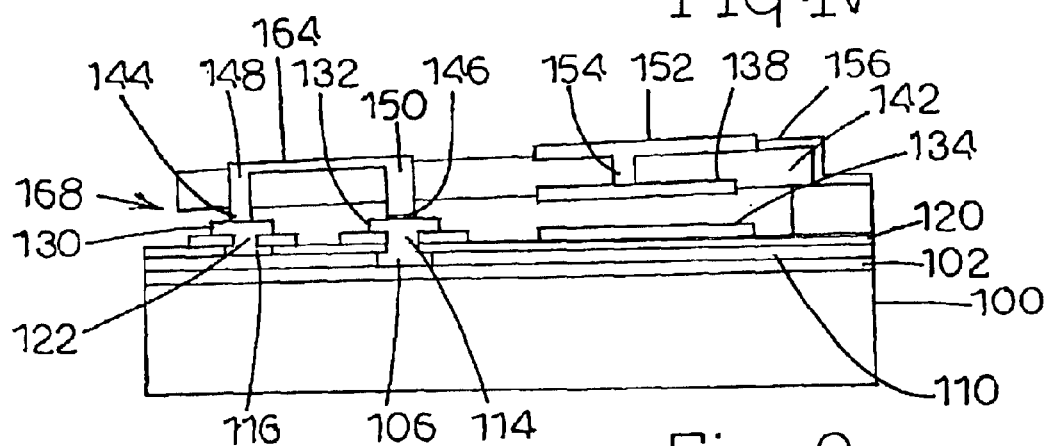
FIG. 2 illustrates a cross-sectional side view of a MEMS switch having a trilayered beam in a "closed" position.

Referring to FIG. 2, the fabricated MEMS switch is illustrated in a "closed" position wherein first movable contact 144 contacts first stationary contact 130 and second movable contact 146 contacts second stationary contact 132. Thus, in the "closed" position, an electrical connection is established between first movable contact 144 and first stationary contact 130 and between second movable contact 146 and second stationary contact 132. Additionally, electrical connection is established between first conductive microstructure 106 and second conductive microstructure 116 by the configuration of components 148, 150, and 164. The MEMS switch is returned to an "pen" position when the voltage applied across movable electrode 138 and stationary electrode 134 is reduced sufficiently such that the reflexive force of structural layer 142 returns beam 168 to a natural position.

Figure 3A:
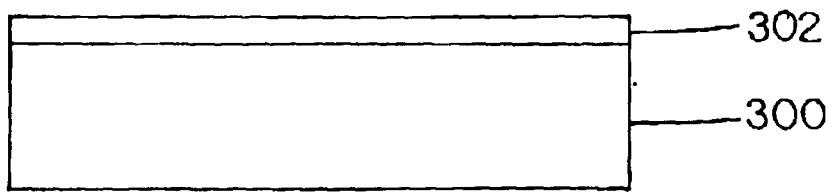
FIGS. 3A–3K illustrate fabrication steps of another embodiment of a method for fabricating a MEMS switch having a trilayered beam.

Referring to FIGS. 3A–3K, another embodiment of a method for fabricating a MEMS switch having a trilayered beam according to a surface micromachining process of the present invention will now be described. Referring specifically to FIG. 3A, a substrate 300 is provided. Substrate 300 comprises silicon. Alternatively, substrate 300 can comprise any other suitable material known to those of skill in the art. If the composition of substrate 300 is chosen to be a conductive or semi-conductive material, a non-conductive, first dielectric layer 302 is deposited on the top surface of substrate 300, or at least a portion of the top surface where electrical contacts or conductive regions are desired.

Figure 3B:
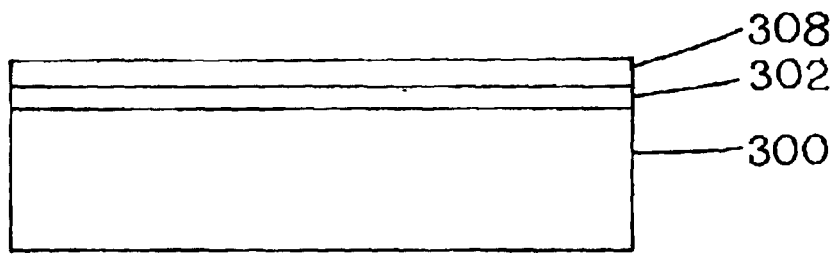
Figure 3C:
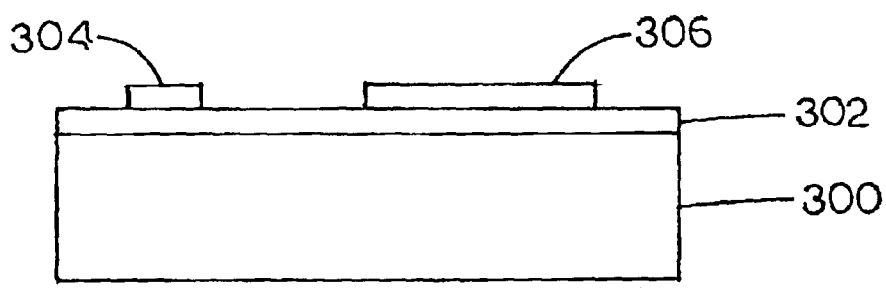

Referring to FIG. 3B–3C, a process for producing a stationary contact 304 and a stationary electrode 306 is illustrated. Referring to FIG. 3B, a first conductive layer 308 is deposited on first dielectric layer 302. First conductive layer 308 is patterned as described above. Referring to FIG. 3C, stationary contact 304 and stationary electrode 306 are formed simultaneously. Alternatively, stationary contact 304 and stationary electrode 306 can be formed in separate processes.

Figure 3D:
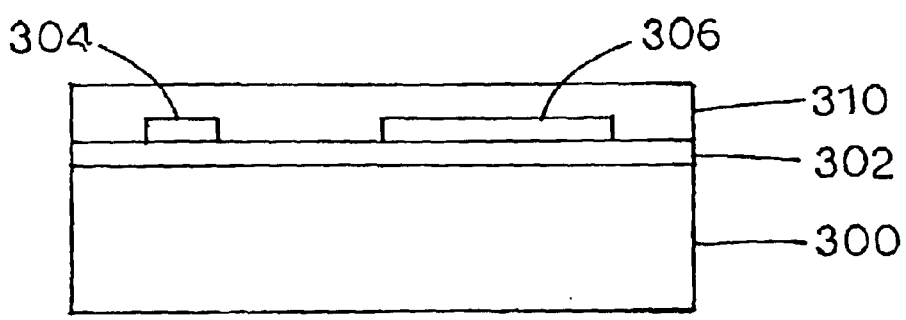

Referring to FIG. 3D, a sacrificial layer 310 is deposited to a uniform thickness such that its top surface is preferably planarized. Sacrificial layer 310 defines the gap between stationary contact 304 and stationary electrode 306 and a trilayered beam structure, described in detail below. Sacrificial layer 310 comprises a polymer. Alternatively, sacrificial layer 310 can be a metal, dielectric or any other suitable material known to those of skill in the art such that the removal chemistry is compatible with the other electrical and structural materials.

Alternatively, sacrificial layer 310 can be patterned and etched such that contact bumps are recessed below structures formed on the underside of the beam structure or to form a larger structure that is recessed. Alternatively, recesses can be formed by other suitable means known to those of skill in the art.

Figure 3E:
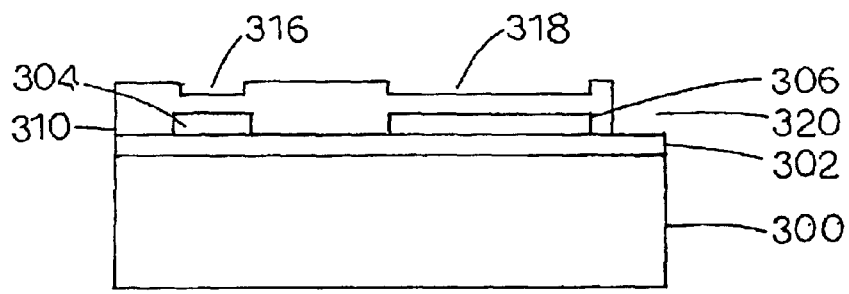
Figure 3F:
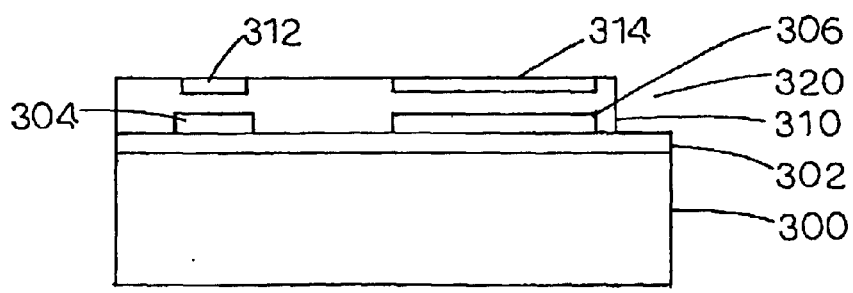

Referring to FIGS. 3E–3F, a process for producing a movable contact 312 and a movable electrode 314 is illustrated. Referring to FIG. 3E, grooves 316, 318 and 320 are etched in sacrificial layer 310. Grooves 316 and 318 are etched in sacrificial layer 310 for movable contact 312 and movable electrode 314, respectively. Groove 320 is formed for forming a structure to attach the beam to substrate 300 and suspend the beam above components 304 and 306. Referring now to FIG. 3F, a conductive layer is deposited on sacrificial layer 310 until grooves 316 and 318 are filled. Next, the conductive layer is patterned as described above to form movable contact 312 and movable electrode 314.

Figure 3G:
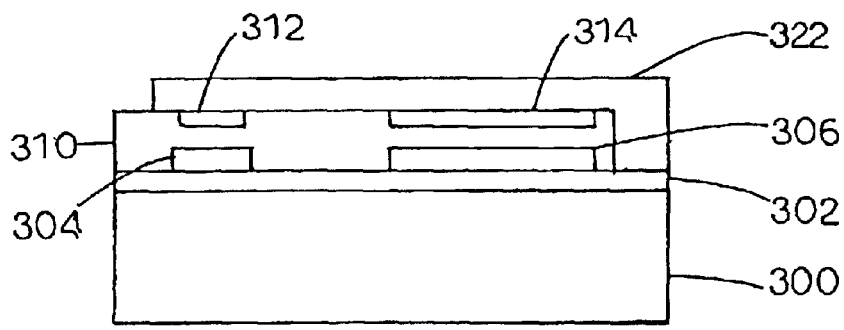

Referring to FIG. 3G, a structural layer 322 is deposited on movable contact 312, movable electrode 314, sacrificial layer 310, and first dielectric layer 302. Structural layer 322 comprises oxide in this embodiment.

Figure 3H:
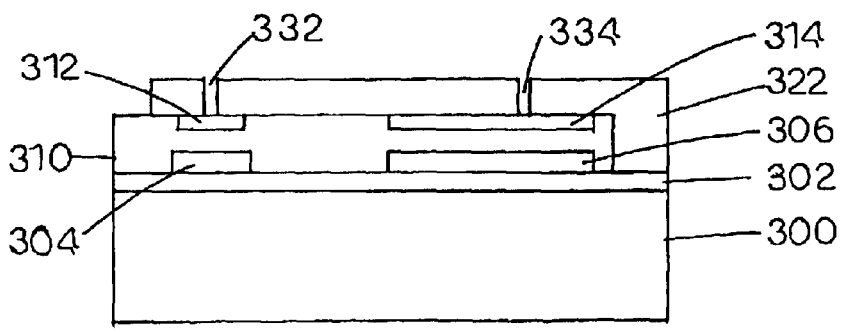
Figure 3I:
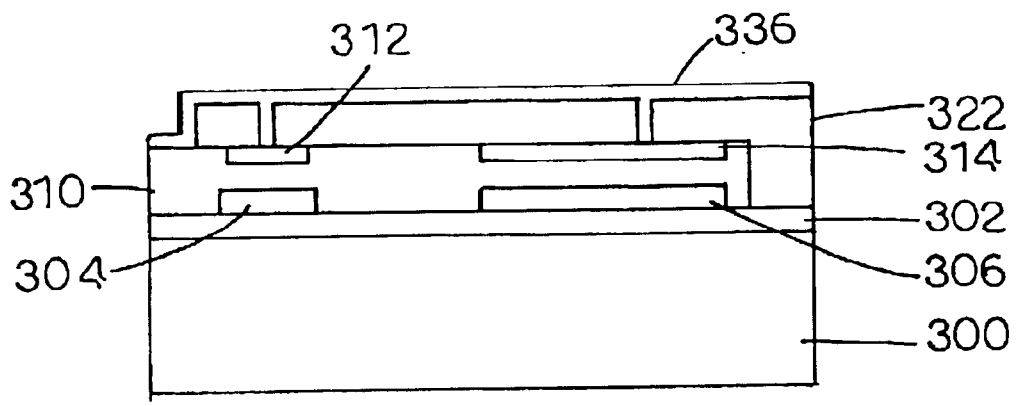
Figure 3J:
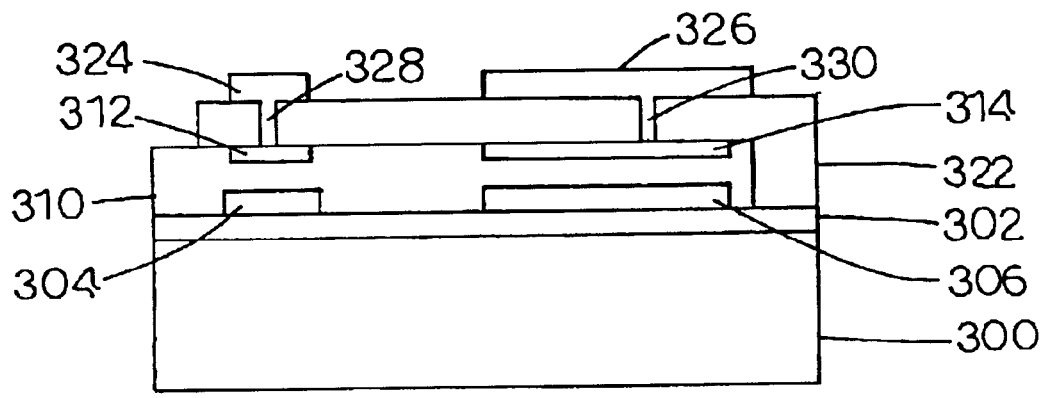

Referring to FIG. 3H–3J, a process for simultaneously producing the following conductive microstructures: a contact interconnect 324, an electrode interconnect 326, and interconnect vias 328 and 330. Referring specifically to FIG. 3H, recesses 332 and 334 are etched into structural layer 322 for forming interconnect vias 328 and 330, respectively. Recesses 332 and 334 are etched through structural layer 322 to movable contact 312 and movable electrode 314.

Referring now to FIG. 3I, a second conductive layer 336 is deposited on structural layer 322 and into recesses 332 and 334 as shown for forming an electrical connection from movable contact 312 and movable electrode 314 to the top surface of structural layer 322. Next, second conductive layer 336 is patterned for forming contact interconnect 324 and electrode interconnect 326 as shown in FIG. 3J. Interconnect vias 328 and 330 can be formed by another conductive layer that would precede the deposition of second conductive layer 336 described above.

Stationary contact 304, stationary electrode 306, movable contact 312, movable electrode 314, electrode interconnect 326, contact interconnect 324, and interconnect vias 328 and 330 comprise a metal in this embodiment. Preferably, movable electrode 314 and electrode interconnect 326 are fabricated of the same material and dimensioned the same in order to perform two functions. First, it provides mechanical balance on both sides of structural layer 322. The mechanical balance is provided because of the elastic symmetry, because the films are deposited in the same way to produce a symmetric stress field, and because the thermal expansion properties are symmetric. The elastic symmetry is preserved by using the same material and by using the same dimensions. The symmetric stress field is produced by depositing the same materials using the same process and thicknesses. The symmetric thermal expansion properties minimize any variation in the switch operation with respect to temperature because the same material is on either side of structural layer 322. This means that any functional variation exhibited by the MEMS switch depends primarily on the process variation, which can be minimized by the appropriate optimization of the design in the process. Secondly, it helps the current carrying capacity of the contact. It is preferable that the trilayered beam has the same type metal, deposited by the same process, patterned in the same geometry, and deposited to the same thickness, but the use of different materials could be accommodated with the appropriate design and characterization. To address the issues of contact adhesion, cold welding, or hot welding, stationary contact 304, stationary electrode 306, movable electrode 314, movable contact 312, electrode interconnect 326, contact interconnect 324, and interconnect vias 328 and 330 could be different materials or different alloys of the same materials. The material selection minimizes contact resistance and failures such as stiction.

Figure 3K:
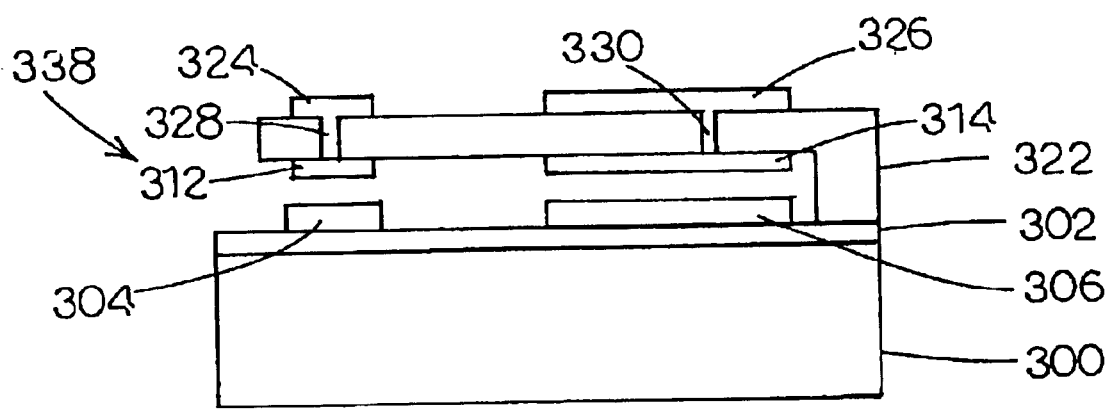

Referring to FIG. 3K, the final step in fabricating the MEMS switch is illustrated. In this step, sacrificial layer 310 is removed to form a trilayered beam, generally designated 338. Sacrificial layer 310 can be removed by any suitable method known to those of skill in the art.

The MEMS switch is illustrated in an "open" position. In a "closed" position, beam 338 is deflected towards substrate 300 and movable contact 312 contacts stationary contact 304. As described above, a voltage can be applied across electrode interconnect 326 and statonary electrode 306 for moving the MEMS switch into a "closed" position.

It will be understood that various details of the invention may be changed without departing from the scope of the invention. The switch embodiments described above can be applied to cantilever beams, doubly supported beams, plates or other known type switch geometries known to those of skill in the art. Furthermore, the foregoing description is for the purpose of illustration only, and not for the purpose of limitation—the invention being defined by the claims.

What is claimed is:

1. A method for fabricating a trilayered beam, comprising:
   (a) depositing a sacrificial layer on a substrate;
   (b) depositing a first conductive layer on the sacrificial layer;
   (c) forming a first conductive microstructure by removing a portion of the first conductive layer;
   (d) depositing a structural layer on the first conductive microstructure and the sacrificial layer;
   (e) forming a via through the structural layer to the first conductive microstructure;
   (f) depositing a second conductive layer on the structural layer and in the via;
   (g) forming a second conductive microstructure by removing a portion of the second conductive layer, wherein the second conductive microstructure electrically communicates with the first conductive microstructure through the via; and
   (h) removing a sufficient amount of the sacrificial layer so as to separate the first conductive microstructure from the substrate, wherein the structural layer is supported by the substrate at a first end and is freely suspended above the substrate at an opposing second end.

2. The method of claim 1 wherein the substrate is composed of a material selected from the group consisting of silicon, silica, glass, quartz, sapphire, zinc oxide, alumina, Group III–V compounds, and alloys thereof.

3. The method of claim 1 wherein the first conductive microstructure is composed of a material selected from the group consisting of gold, nickel, iron and alloys thereof.

4. The method of claim 1 wherein the second conductive microstructure is composed of a material selected from the group consisting of gold, nickel, iron and alloys thereof.

5. The method of claim 1 wherein the structural layer is composed of a material selected from the group consisting of polysilicon, silicon nitride, silicon dioxide, silicon carbide, aluminum and alloys thereof.

6. The method of claim 1 wherein the first conductive microstructure and the second conductive microstructure have substantially the same shape and dimensions.

7. A method for fabricating an actuator having a trilayered beam, comprising:
   (a) forming a first electrode on a substrate;
   (b) depositing a sacrificial layer on the first electrode and the substrate;
   (c) forming a second electrode on the sacrificial layer;
   (d) depositing a structural layer on the second electrode and the sacrificial layer;
   (e) forming a via through the structural layer to the second electrode;
   (f) depositing a conductive layer on the structural layer and in the via;
   (g) forming a conductive microstructure by removing a portion of the conductive layer, wherein the conductive microstructure electrically communicates with the second electrode through the via; and
   (h) removing a sufficient amount of the sacrificial layer so as to separate the second electrode from the substrate, wherein the structural layer is supported by the substrate at a first end and is freely suspended above the substrate at an opposing second end.

8. The method of claim 7 wherein the substrate is composed of a material selected from the group consisting of silicon, silica, glass, quartz, sapphire, zinc oxide, alumina, Group III–V compounds, and alloys thereof.

9. The method of claim 7 wherein the first electrode is composed of a material selected from the group consisting of gold, nickel, iron and alloys thereof.

10. The method of claim 7 wherein the second electrode is composed of a material selected from the group consisting of gold, nickel, iron and alloys thereof.

11. The method of claim 7 wherein the first and second electrodes have substantially the same shape and dimensions.

12. The method of claim 7 further including providing a voltage source having an electrical connection across the first electrode and the conductive microstructure.

13. The method of claim 7 further including providing a first contact attached to the structural layer and a second contact attached to the substrate for contacting when a voltage is applied across the first electrode and the conductive microstructure.

14. The method of claim 7 wherein the first electrode is formed from a layer of conductive material deposited on the substrate.

15. The method of claim 7 wherein the second electrode is formed from a layer of conductive material deposited on the sacrificial layer.

16. A method for fabricating a microscale switch having a trilayered beam, comprising:
   (a) forming a first electrode on a substrate;
   (b) forming a first contact on the substrate;
   (c) depositing a sacrificial layer on the first electrode, the first contact, and the substrate;
   (d) forming a second electrode on the sacrificial layer;
   (e) forming a second contact on the sacrificial layer;
   (f) depositing a structural layer on the second electrode, the second contact, and the sacrificial layer;
   (g) forming a first conductive, interconnect via through the structural layer to the second electrode;
   (h) forming a second conductive, interconnect via through the structural layer to the second contact;
   (i) forming an electrode interconnect on the structural layer that contacts the first interconnect via; and
   (j) forming a contact interconnect on the structural layer that contacts the second interconnect via.

17. The method of claim 16 wherein the electrode interconnect and the second electrode have substantially the same shape and dimensions.

18. The method of claim 16 wherein the contact interconnect and the second contact have substantially the same shape and dimensions.

19. A method for fabricating a microscale switch having a cross-bar interconnect, comprising:
   (a) forming a conductive interconnect on a substrate;
   (b) depositing dielectric layer on the conductive interconnect;

(c) forming a first conductive, interconnect via through the dielectric layer to the conductive interconnect;

(d) forming a first contact on the dielectric layer wherein the first contact connects to the first interconnect via;

(e) forming a first electrode on the substrate;

(f) depositing a sacrificial layer on the first electrode, the first contact, and the substrate;

(g) forming a second electrode on the sacrificial layer;

(h) forming a second contact on the sacrificial layer;

(i) depositing a structural layer on the second electrode, the second contact, and the sacrificial layer;

(j) forming a second conductive, interconnect via through the structural layer to the second electrode;

(k) forming a third conductive, interconnect via through the structural layer to the second contact;

(l) forming an electrode interconnect on the structural layer that contacts the second interconnect via; and (m) forming a contact interconnect on the structural layer that contacts the third interconnect via.

20. A method for fabricating a microscale switch having a trilayered beam, comprising:

(a) forming a first and second conductive interconnect on a substrate;

(b) depositing at least one dielectric layer on the first and second conductive interconnect;

(c) forming a first and second conductive, interconnect via through the at least one dielectric layer to the first and second conductive interconnects, respectively;

(d) forming a first and second contact on the dielectric layer wherein the first contact connects to the first interconnect via and the second contact connects to the second interconnect via;

(e) forming a first electrode on the substrate;

(f) depositing a sacrificial layer on the first electrode, the first contact, and the second contact;

(g) forming a second electrode on the sacrificial layer;

(h) forming a third and fourth contact on the sacrificial layer;

(i) depositing a structural layer on the second electrode, the third contact, the fourth contact, and the sacrificial layer;

(j) forming a third conductive, interconnect via through the structural layer to the second electrode;

(k) forming a fourth and fifth conductive, interconnect via through the structural layer to the third and fourth contacts, respectively;

(l) forming an electrode interconnect on the structural layer that contacts the third interconnect via; and (m) forming a contact interconnect on the structural layer that contacts the fourth and fifth interconnect vias.

21. A method of implementing switching function in a switch having conductive interconnects, the method comprising:

(a) providing a switch having conductive interconnects, the switch comprising:

(i) a substrate having a first and second conductive interconnect and a stationary electrode;

(ii) first and second dielectric layers formed on the first and second conductive interconnects, respectively;

(iii) first and second stationary contacts attached to the first and second dielectric layers, respectively, and having electrical communication with the first and second conductive interconnects, respectively;

(iv) a movable structural layer including a bottom surface suspended over the first and second stationary contacts and a top surface opposing the bottom surface;

(v) a movable electrode attached to the bottom surface of the structural layer whereby the movable electrode is separated from the stationary electrode by a gap;

(vi) an electrode interconnect attached to the top surface of the structural layer and connected to the movable electrode for electrical communication; and (vii) a movable contact attached to the bottom surface of the structural layer and positioned to contact the first and second stationary contacts when the structural layer moves towards the first and second stationary contacts; and (b) applying a voltage between the electrode interconnect and the stationary electrode to electrostatically couple the movable electrode with the stationary electrode across the gap, whereby the resilient structural layer is deflected toward the substrate and the movable contact contacts the first and stationary contacts for establishing electrical communication between the first and second conductive interconnects.

* * * * *